United States Patent
Telford

(10) Patent No.: US 9,711,943 B2
(45) Date of Patent: Jul. 18, 2017

(54) METHOD AND SYSTEM FOR COMMUNICATING WITH A LASER POWER DRIVER

(75) Inventor: Steven Telford, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 180 days.

(21) Appl. No.: 13/290,416

(22) Filed: Nov. 7, 2011

(65) Prior Publication Data

US 2013/0114632 A1    May 9, 2013

(51) Int. Cl.
| | |
|---|---|
| H01S 5/40 | (2006.01) |
| H01S 5/042 | (2006.01) |
| H01S 5/00 | (2006.01) |
| H01S 5/062 | (2006.01) |

(52) U.S. Cl.
CPC .......... *H01S 5/0428* (2013.01); *H01S 5/4025* (2013.01); *H01S 5/0021* (2013.01); *H01S 5/06216* (2013.01)

(58) Field of Classification Search
CPC .............................. H01S 5/0427; H01S 5/0428
USPC ................. 372/38.02, 38.07, 29.015, 50.122
See application file for complete search history.

(56) References Cited

U.S. PATENT DOCUMENTS

| | | | |
|---|---|---|---|
| 3,656,175 A * | 4/1972 | Carlson et al. ............... 347/250 |
| 5,623,355 A | 4/1997 | Olsen | |
| 6,081,356 A * | 6/2000 | Branc et al. .................. 398/129 |
| 6,278,535 B1 * | 8/2001 | Shanton, III ...................... 398/9 |
| 6,290,141 B1 | 9/2001 | Park et al. | |
| 6,476,953 B1 * | 11/2002 | Morkel .......................... 398/175 |
| 7,035,290 B1 | 4/2006 | Lyle | |
| 2003/0076569 A1 | 4/2003 | Stevens | |
| 2008/0205900 A1 | 8/2008 | Cole et al. | |
| 2009/0010651 A1 * | 1/2009 | Prater ............................ 398/130 |
| 2009/0092162 A1 * | 4/2009 | Huff et al. ........................ 372/36 |
| 2013/0259483 A1 * | 10/2013 | McLaren ............... H04J 14/02 398/79 |

FOREIGN PATENT DOCUMENTS

WO    02/054650 A2    7/2002

OTHER PUBLICATIONS

Extended European Search Report of Jul. 10, 2015 for European Patent Application No. 12847385.7; 5 pages.

* cited by examiner

*Primary Examiner* — Tod T Van Roy
(74) *Attorney, Agent, or Firm* — Kilpatrick Townsend & Stockton

(57) ABSTRACT

A system for controlling a plurality of laser diodes includes an optical transmitter coupled to the laser diode driver for each laser diode. An optical signal including bi-phase encoded data is provided to each laser diode driver. The optical signal includes current level and pulse duration information at which each of the diodes is to be driven. Upon receiving a trigger signal, the laser diode drivers operate the laser diodes using the current level and pulse duration information to output a laser beam.

24 Claims, 5 Drawing Sheets

| No. of Bits | Data Type | Additional information |
|---|---|---|
| 16 | Frame Sysnc | |
| 10 | Address for laser diode driver | |
| 10 | Current level information | Range of 0-550 Amps |
| 9 | Pluse duration (width) | Range of up to 300 microseconds |
| 1 | Trigger Signal | "fire now" signal |
| 16 | Error Check | E.g. CRC |
| 18 | unused | Future definition |

METHOD AND SYSTEM FOR COMMUNICATING WITH A LASER POWER DRIVER

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

High average power diode pumped lasers are currently being used in or designed into an increasing number of laser systems. Diode-pumped solid state lasers are used in various applications ranging from laser pointers to nuclear fusion engines. In applications where a large number of such lasers are to be controlled with a very high accuracy, conventional means of controlling the lasers are proving to be ineffective.

Despite progress made in methods and systems for controlling large diode-pumped solid state laser (DPSSL) arrays, there is a need in the art for improved methods and systems related to communication with large DPSSL arrays.

SUMMARY OF THE INVENTION

The present invention relates generally to lasers. More specifically, embodiments of the present invention provide methods and systems for controlling an array of laser diodes in order to provide precise operation of each of the laser diodes in the array. The methods and techniques can be applied to a variety of laser diode systems.

Some embodiments of the present invention provide a method for operating a laser diode. The method includes providing a laser driver coupled to an optical receiver. The method further includes providing a laser source coupled to the laser diode driver. The laser diode driver in conjunction with the optical receiver then receives an optical signal. In some embodiments, the optical signal includes information about a current value for operating the laser source and a duration for which the laser source is to be turned on. The optical signal is analyzed to determine the current value and the duration and the laser source is operated based on the current value and the duration.

Certain embodiments of the present invention provide a laser diode array. The laser diode array includes a plurality of laser diodes and a plurality of laser diode drivers. Each laser diode driver is coupled to at least one laser diode from the plurality of laser diodes and to an optical receiver. Each of the plurality of laser diode drivers in conjunction with the optical receiver may receive an optical signal including information about a current value for operating the at least one laser diode and a time for which the current value is to be applied to the at least one laser diode, analyze the optical signal to extract the current value and the time information, and provide a current equal to the current value to the at least one laser diode for the time specified in the optical signal.

Some embodiments of the present invention provide a system. The system includes a laser diode controller configured to provide a current value and a duration value for operating a laser diode. The system also includes an optical signal generator coupled to the laser diode controller. The optical signal generator can receive the current value and the duration value from the laser diode controller and generate an optical signal comprising encoded data that includes the current value and the duration value. The system may also include an optical transmitter coupled to the optical signal generator. The optical signal transmitter can transmit the optical signal. The system may further include a laser diode driver coupled to the optical transmitter, an optical receiver, and to the laser diode. The laser diode driver in conjunction with the optical receiver may receive the optical signal, decode the encoded data to determine the current value and the duration value, and provide a current equal to the current value to the laser diode and for a time equal to the duration value.

Numerous benefits are achieved by way of the present invention over conventional techniques. For example, embodiments of the present invention provide optical systems that are resistant to aging effects that can impact system performance. Additionally, embodiments of the present invention reduce or eliminate complex wiring systems associated with conventional laser diode systems. In some embodiments, the number of system components is reduced, resulting in overall system cost savings. These and other embodiments of the invention along with many of its advantages and features are described in more detail in conjunction with the text below and attached figures.

DETAILED DESCRIPTION OF SPECIFIC EMBODIMENTS

Figure 1:
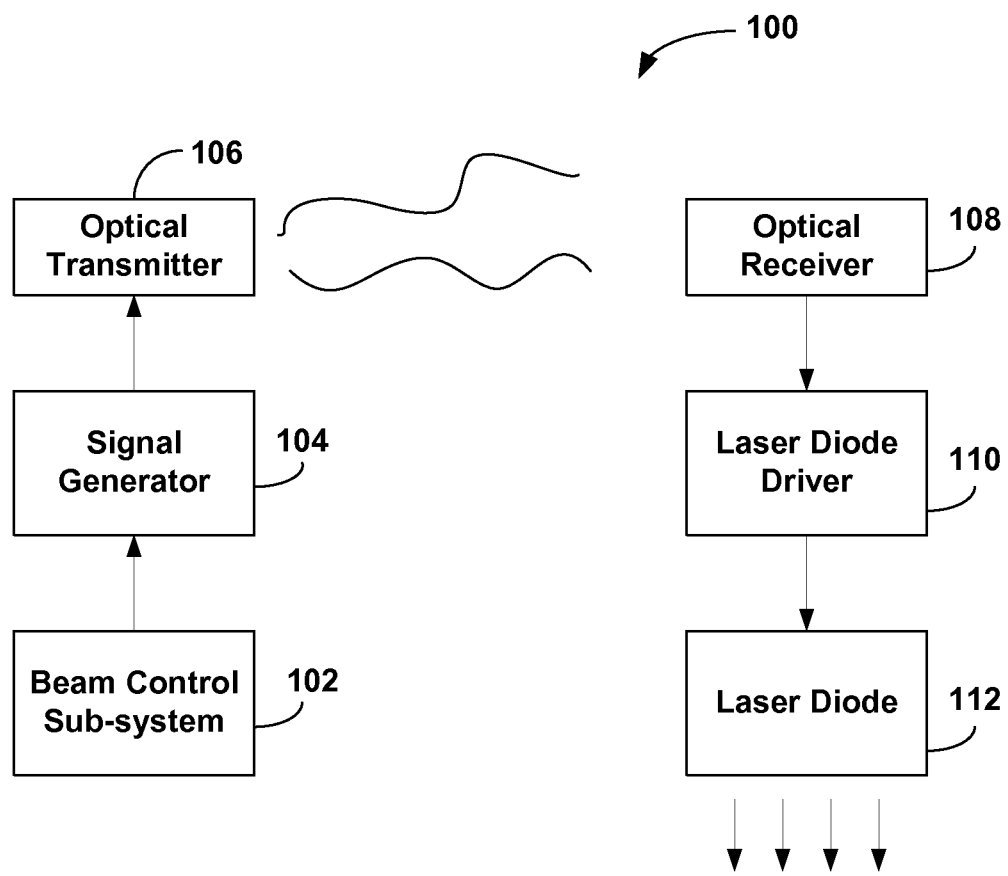
FIG. 1 is a functional block diagram of a system for controlling a laser diode according to an embodiment of the present invention.

Embodiments of the present invention generally relate to lasers. Certain embodiments of the present invention provide methods and systems for controlling an array of laser diodes in order to provide precise operation of each of the laser diodes in the array.

High average power diode laser arrays used for pumping of laser amplifiers, which may be used for IFE (Inertial Fusion Engine) power plants, utilize power conditioning systems to pulse the diode laser arrays at precise currents, pulse rates, and duty factors. Precise control of the current levels, pulse rates, and timing to trigger the laser diodes in the array is needed in order to generate optimum conditions in the IFE power plants.

Conventionally, each of the laser diode in an array was wired to a central control system that provided the signal to indicate when to fire the laser as well as the current level that was to be provided to the laser diode and the duration for which the current pulse was to be applied to the laser diode (also known as the pulse rate). Wired-based signaling systems have a certain latency associated with them. Latency is a measure of time delay experienced in a system. In a laser diode array system, the end-to-end latency can include the delay associated with control signal transmission between the laser controller to the laser diode, processing time of the laser diode driver to process the control signal and delay associated with a laser diode receiving the current from the laser driver and output a laser beam based on the parameters included in the control signal, etc. In addition, as the system ages, these latencies can increase, thereby resulting in the need for constant adjustment of the control signal in order to precisely control the operation of the laser diodes.

In an IFE power generation application, it is beneficial to have all the laser diodes fire at the same time in order to provide optimal energy to initiate the fusion reaction. If the laser diodes do not all fire at the same time, it may result in less energy being provided to the fusion engine, resulting in failure of the fusion reaction. As the wired-based systems age, not only does the system end-to-end latency change, but latency among individual connections to each laser diode may also vary, making it challenging to maintain precise operating parameters for these laser diodes.

Embodiments of the present invention provide optical control mechanisms in order to control the trigger time and other operational parameters of each individual laser diode. Many advantages are realized by embodiments of the present invention over conventional wired-based control systems. Optical systems disclosed herein are less prone to aging and even if aging of components occur, it may be uniform so that precise control is still possible. Optical systems disclosed herein eliminate the clutter and complexity associated with physical connections from the control unit to each individual laser diode. Optical systems disclosed herein may reduce the overall cost of the laser system by using fewer components that last longer.

In some high power laser systems, the laser diodes operate at power levels up to and exceeding 500 amperes. This generates a significant amount of electrical noise. In order to isolate the laser diodes from the electrical noise, a common ground is provided in wired-based electrical systems. Since there may be upwards of 500 laser diodes in each array, the common ground connecting these laser diodes itself generates ground loops. Such ground loops themselves generate electrical noise and also are a shock/arcing hazard. Thus, there is no effective way to eliminate noise in a wire-based electrical system that controls hundreds of devices. Using the optical system as described herein eliminates the need for a common ground, thus effectively reducing or eliminating any electrical noise. Techniques disclosed herein provide a more reliable and robust control system for the laser diodes.

FIG. 1 is a block diagram of a laser diode system 100 according to an embodiment of the present invention. System 100 includes a beam control sub-system 102, a signal generator 104, an optical transmitter 106, an optical receiver 108, a laser diode driver 110, and a laser diode 112.

Beam control sub-system 102 is configured to control the parameters for the laser beam outputted by laser diode 112. In some embodiments, beam control sub-system 102 may determine the current to be applied to a laser diode and a duration for which the current pulse is to be applied to the laser diode. In other words, beam control sub-system 102 may determine the output power level of the laser beam outputted by laser diode 112 and the duration for which the laser beam is outputted by laser diode 112. For example, the current applied to laser diode 112 may be about 200 amps and the current pulse duration may be up to 300 microseconds with an interval of up to 60 milliseconds seconds between two successive current pulses. In some embodiments, beam control sub-system 102 may be used to adjust the current and/or pulse width of each individual laser diode 112. This helps to maintain the optical output of the overall diode array at a constant desired level. Ability to control outputs of each laser diode 112 may help in adjusting for diode or diode array degradation over time. In some embodiments, beam control sub-system 102 may communicate the current level and pulse duration information to signal generator 104. In some embodiments, beam control subsystem may include control and processing circuitry that communicates with one or more external systems to determine the power level and the duration.

Signal generator 104 can be implemented using a commonly available optical signal generator, e.g., a field programmable gate array (FPGA) available from Xilinx Inc. A signal generator is an electronic device that generates repeating or non-repeating electronic signals in either an analog or an digital domain. In some embodiments, signal generator 104 can receive the inputs from beam control subsystem 102 and generate an optical signal based on the inputs. For example, signal generator may receive the current level and pulse duration information from beam control sub-system 102, generate an optical signal that encodes the current level and pulse duration information and communicate that optical signal to optical transmitter 106. In some embodiments, signal generator 104 may generate an optical signal that includes bi-phase encoded data. The bi-phase encoded data may include the current level and duration information. In this instance, the optical signal acts as a carrier signal for transmitting the encoded data.

Optical transmitter 106 can be any transmitter that is able to receive an optical signal and transmit that optical signal. In some embodiments, optical transmitter may include an infrared photodiode. In a particular embodiment, an optical transmitter such as e.g., OSRAM SHF420 or SHF425 may be used. However, it is to be noted that other types of optical transmitters may also be used successfully. In some embodiments, signal generator 104 and optical transmitter 106 may be implemented as a single integrated unit.

Optical receiver 108 can be implemented using any conventional optical receiver that is able to receive an optical signal and decode the optical signal to extract the current level and duration information. In some embodiments, optical receiver 108 may include a photo diode coupled to a mixed-signal microcontroller. The photo diode may receive the optical signal and the microcontroller may decode the data included in the optical signal to determine the current level and pulse duration information embedded in the optical signal.

In some embodiments, optical receiver 108 may communicate the current level and pulse duration information to laser diode driver 110. Laser diode driver 110 is used to drive laser diode 112 to generate a laser beam using the current level applied for a desired duration of time. In some embodiments, laser diode driver 110 can receive the current level and pulse duration information from optical receiver 108 and use that information to cause laser diode 112 to generate laser beam that conforms to those parameters. In some embodiments, laser diode driver 110 and optical receiver 108 may packaged in a single enclosure and coupled to each other. In other embodiments, optical receiver 108 may be physically attached to laser diode driver 110. In some embodiments, a single laser diode driver may control a single laser diode. In other embodiments, a single laser diode driver may control multiple laser diodes mounted in a laser diode bar. For example, a laser diode bar may include up to 50 laser diodes. The laser diode driver may control multiple diode bars configured as a diode tile. Each tile can have up to 50 diode bars. The laser diode driver may also control multiple diode tiles. A single diode driver may control as many as 15 diode arrays. In still other embodiments, a single laser diode driver may control an array of laser diodes. Details of a laser diode driver that may be used in embodiments of the present invention are disclosed in commonly-owned and co-pending U.S. patent application Ser. No. 12/813,662, filed on Jun. 11, 2010, the contents of which are incorporated by reference herein in their entirety for all purposes.

Laser diode driver 110 is coupled to a laser diode 112. Laser diode 112 can be implemented using any of the commercially available laser diodes from companies including Northrop Grumman Corp. and nLight Corp, among others. In some embodiments, laser diode 112 receives current from laser diode driver 110 for specific duration, e.g., 50 microseconds, that causes laser diode 112 to output a laser beam based on the current for the specific duration. This process may be repeated for up to 16 times per second resulting in a pulsed operation of laser diode 112.

Further, while system 100 is described herein with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present invention can be realized in a variety of devices including electronic devices implemented using any combination of circuitry and software.

As described above, each laser diode is coupled to a corresponding laser diode driver that drives the laser diode to output a laser beam. In a conventional system, each laser diode driver would be hard-wired back to the beam control sub-system. In an IFE-type application, there may be up to 1000 laser diode tiles that are "fired" or "turned on" at the same time to provide a certain desired output. As described above, precise control of the timing for firing the laser diodes is important. Also, it is desirable that all the laser diodes output a laser beam with specific power level and for a specified duration. In a system which has such enormous number for laser diodes, there are instances when certain laser diodes "age" in comparison to other laser diodes. As laser diodes age, the light output from them for a fixed current input diminishes over time. Thus, older laser diodes may need to be driven at higher input current levels compared to newer laser diodes in order to achieve the same power output. For instance, consider that laser diode #12 is new and laser diode #456 is an older laser diode that has been operating for a few years. Both laser diodes can be in the same array or a different array. In this instance, more current would be needed to drive laser diode #456 to output a laser beam having certain power than laser diode #12, which would need less current or shorter pulse width compared to laser diode #456 to output a laser beam having the same power level. Thus, the encoded data transmitted to laser diode #456 will have different parameters than the encoded data transmitted to laser diode #12.

In order to ensure that all of the 1000 or so laser diodes output laser beams with the same or substantially same output power level, some laser diodes may need a different current input or pulse width input than others as described above. In order to ensure that each laser diode can be individually controlled, the laser diode driver associated with a laser diode may be assigned a unique address. In some embodiments, the optical signal may include the unique address associated with a laser diode driver. For instance, each laser diode driver may be assigned a unique 10-bit address. The optical signal transmitted may include the 10-bit address for a laser driver along with the current level and pulse duration information. When the optical receiver receives the optical signal, it may extract the address information and provide that to the laser driver. The laser driver may determine whether the extracted address matches its own address. If the extracted address matches the address assigned to the laser diode driver, the laser diode driver can use the current level and pulse duration information from the optical signal to drive the associated laser diode. If the addresses do not match, the laser diode driver can ignore the information in the optical signal. In this manner each individual laser diode can be controlled precisely to output the desired power level.

In addition to outputting the same power level and for the same duration, it is desirable that all the 1000 or so laser diodes fire at the same time thus providing maximum power for the fusion process to start. In order to ensure that all the laser diodes fire at the same time, in some embodiments, the beam control sub-system may send a "fire now" signal to each of the laser diode drivers at the appropriate time. In some embodiments, the laser diodes are operated up to 16 times per second. Thus, a "fire now" signal may be communicated to the laser diodes for up to 16 times per second. Once the laser diode drivers receive the "fire now" signal, each laser diode driver applies the specified current level for the specified time to its associated laser diode and as a result each laser diode outputs a laser beam based on the parameters received from the laser diode drivers.

In some embodiments, the optical signal communicating the bi-phase encoded data including the current level and the pulse duration information can be sent between two consecutive "fire now" signals. Thus, when the "fire now" signal is received by a laser diode driver, it will have already received the current level and pulse duration information to be used for the associated laser diode. In some embodiments, the output of each laser diode is monitored for every operation cycle and the information fed back to the beam control system. The beam control subsystem then determines whether the output of a laser diode needs to be adjusted and by how much to output the desired power level. In some embodiments, only the laser diodes for whom the output needs to be adjusted may receive a signal prior to a "fire now" signal. If no change in output is needed based on the feedback, no signal may be sent to that particular laser diode. In this instance, if a laser diode driver does not receive current level and duration parameters prior to a "fire now" signal, it may use the last received parameters to operate the laser diode. In some embodiments, in order to achieve this, the optical signal includes address information for the concerned laser diode driver along with the new parameters. Thus, only those laser diode drivers whose addresses match the addresses in the optical signal will extract the new parameters. All other laser diode drivers may ignore the information in the optical signal and use the last received parameters for operating their associated laser diodes.

As discussed above, the optical signal is sent to each of the laser diode drivers and the optical signal includes address information for each of the laser diode drivers. In some embodiments, the laser diodes are arranged in an array form where tens of hundreds laser diodes may be coupled together on a common frame and light outputted from the laser diodes may be collimated. In this instance, the optical signal can be used to communicate information to an entire array of laser diodes, where the array of laser diodes may have a single unique address.

Figure 2:
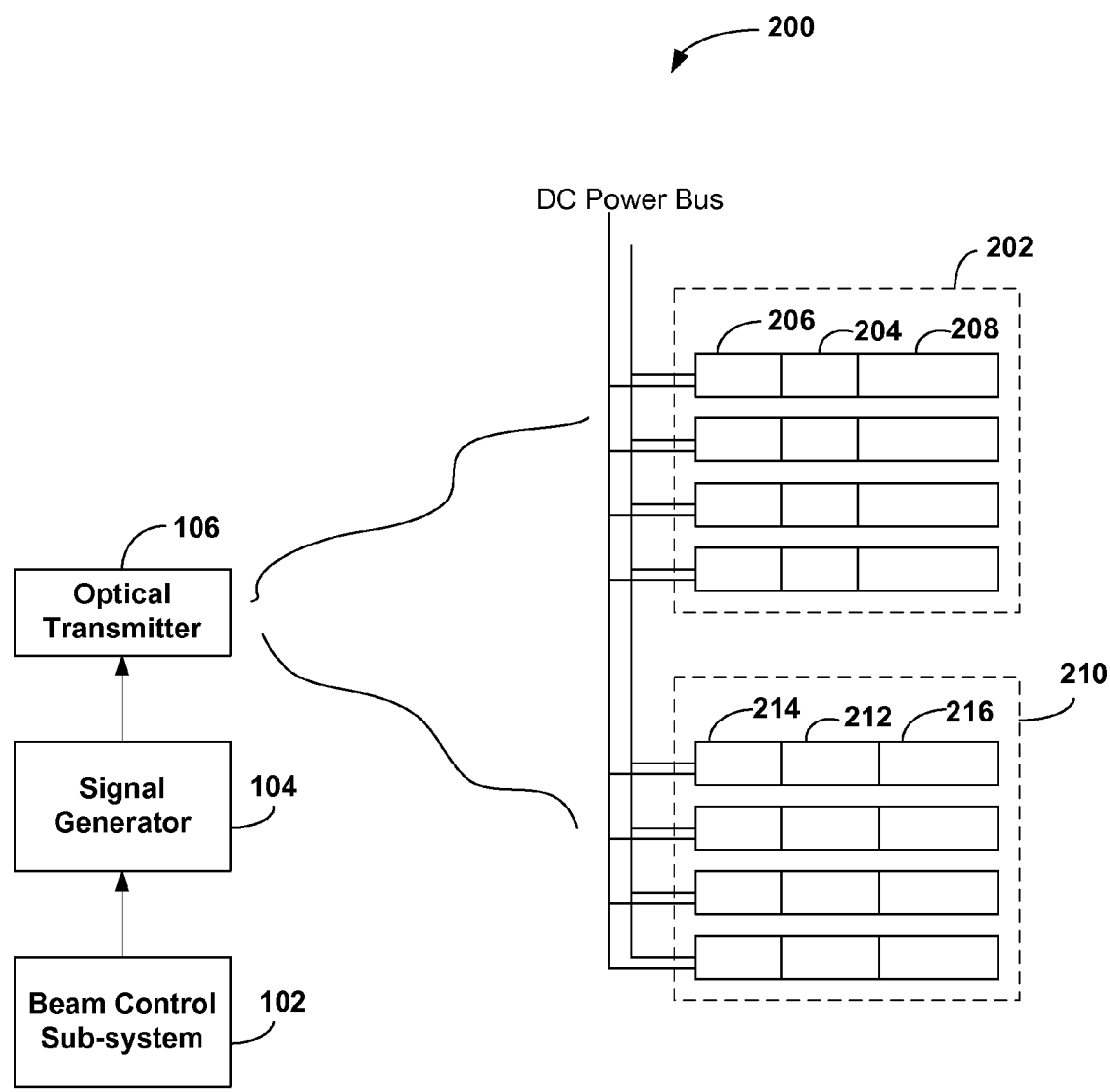
FIG. 2 is block diagram of a system for controlling multiple arrays of laser diodes according to an embodiment of the present invention.

FIG. 2 illustrates system 200 including two arrays of laser diodes. It is to be noted that only two arrays are shown in FIG. 2 for ease of explanation. One skilled in the art will realize that more than two arrays can be included in system 200. Array 202 includes one or more laser diodes 208 and laser diode drivers 204. Each laser diode 208 and laser diode driver 204 is coupled to an optical receiver 206. A second array 210 may also include one or more laser diodes 216 and laser diode drivers 212 and each of laser diodes 216 and laser diode drivers 212 is coupled to a optical receiver 214. In some embodiments, each array 202, 210 may be assigned an address and the laser diode drivers in that array may all respond to that address. In this instance, the optical signal may include current level and pulse duration information for each array instead of each individual laser diode. All laser diode drivers in an array may use the same current level and pulse duration information to drive the laser diodes to generate a laser beam. This may greatly reduce the complexity of the optical signal.

In other embodiments, instead of a single laser diode, element 208 may correspond to a laser diode bar 208. Each laser diode bar 208 may include multiple laser diodes, e.g., 50. In this instance, laser diode driver 204 may drive all the laser diodes in laser diode bar 208. Each laser diode driver 204 may be assigned a unique address. Thus, when the optical signal includes current and duration information for an address associated with laser diode driver 204, it may operate all laser diodes on laser diode bar 208 using that current and duration information.

Figure 3:
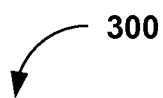
FIG. 3 is table illustrating format for the data received by the optical receiver according to an embodiment of the present invention.

As described above, the optical signal includes bi-phase encoded data that includes current level and duration information for operating the laser diodes and address information associated with one or more laser diode drivers. FIG. 3 is a table 300 that illustrates a format for the bi-phase data that can be communicated using the optical signal according to an embodiment of the present invention. Table 300 illustrates a data length field 302 that indicates the number of bits used to represent the type of data and payload field 304 indicates the corresponding data payload for the number of bits. As can be seen from table 300, the optical signal can include up to 80 bits of data (10 bytes). It is to be noted that table 300 is for illustration purposes only and as one skilled in the art will realize, the encoded data may have many other formats with varying bit lengths for individual information.

From the 80 or so bits, up to 16 bits can be used to indicate the Frame Sync information. A Frame sync pattern is a pattern that appears at the beginning of each date frame that is transmitted. As described above, each laser diode driver can be assigned a unique address. In some embodiments, up to 10 bits can be allocated to the address for each of the laser diode drivers. This may provide the ability to address more than 1000 ($2^{10}$) laser diode driver devices. The address field can be increased to 12 or 16-bits based on the number of individual laser diode driver devices to be addressed. In some embodiments, up to 10 bits may be used to convey the current level information, which may correspond to the input current to be applied to the laser diode. In some embodiments, the current level can range between 1 and 550 Amps. In some embodiments, the current levels can be increased in increments of 1 amp, although other increment intervals may also be used.

In some embodiments, up to 9 bits may be used to indicate the pulse duration or width, which may correspond to the duration for which the laser diodes are to be turned on at a time. In some embodiments, the range of the pulse duration is between 1 μs and 300 μs and may be increased in increments of 1 μs. One skilled in the art will realize that other increment intervals are possible. In some embodiments, 1 bit may be used to communicate the "fire now" command to the laser diodes. For example, a "1" for that bit may indicate that the laser diodes may output a laser beam immediately upon receipt of the command. In addition, up to 16 bits can be used to perform error checking such as cyclic redundancy check (CRC). Any unused bits from the available 80 bits can be used to increase the range for any of the parameters such as current level, address information, etc. For example, additional bits may be added to expand the addressing capability from about 1000 devices to even more devices.

It is to be noted that table 300 is for illustration purposes only and the data format illustrated in table 300 on only exemplary. One skilled in the art will realize that other data formats may be used, e.g., wherein each individual data type being assigned more or less bits than shown in table 300.

Figure 4:
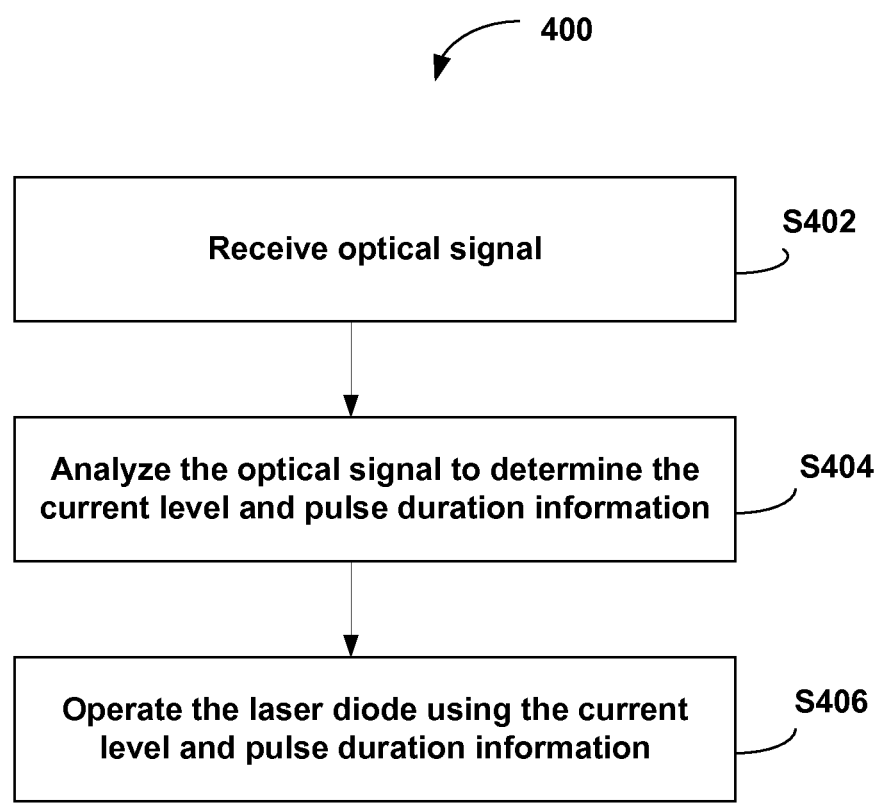
FIG. 4 is a flow diagram of a process for controlling a laser diode according to an embodiment of the present invention.

As described above, an optical signal may include bi-phase encoded data that is used to drive the laser diodes to provide a laser beam with a certain power level for a certain duration. FIG. 4 is a flow diagram of a process 400 for operating laser diode according to an embodiment of the present invention. Process 400 can be performed by a laser diode driver, e.g., laser diode driver 110 of FIG. 1, in conjunction with an optical receiver.

The laser diode driver can receive an optical signal captured by the optical receiver (S402). As described above, the optical signal may include bi-phase encoded data. Once the optical signal is received, the laser diode driver can analyze the optical signal to determine the current value and pulse width (duration) information included in the bi-phase encoded data (S404). Once the current value and the duration information is determined from the optical signal, the laser diode driver can operate the laser diode by providing the current specified in the optical signal and for the time as specified by the duration information (S406). As a result, the laser diode then outputs a laser beam based on the applied current and for a duration substantially equal to the duration for which the current pulse is applied.

It should be appreciated that the specific steps illustrated in FIG. 4 provide a particular method of operating a laser diode according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

As described above, the laser diodes may be arranged in an array. In this instance, process 400 can be used to control each of the laser diodes in an array. In some embodiments, each array may be given a unique address in addition to the address for each of the laser diode drivers. In this instance, the optical signal may also include the array address in addition to the address for the laser diode driver.

Figure 5:
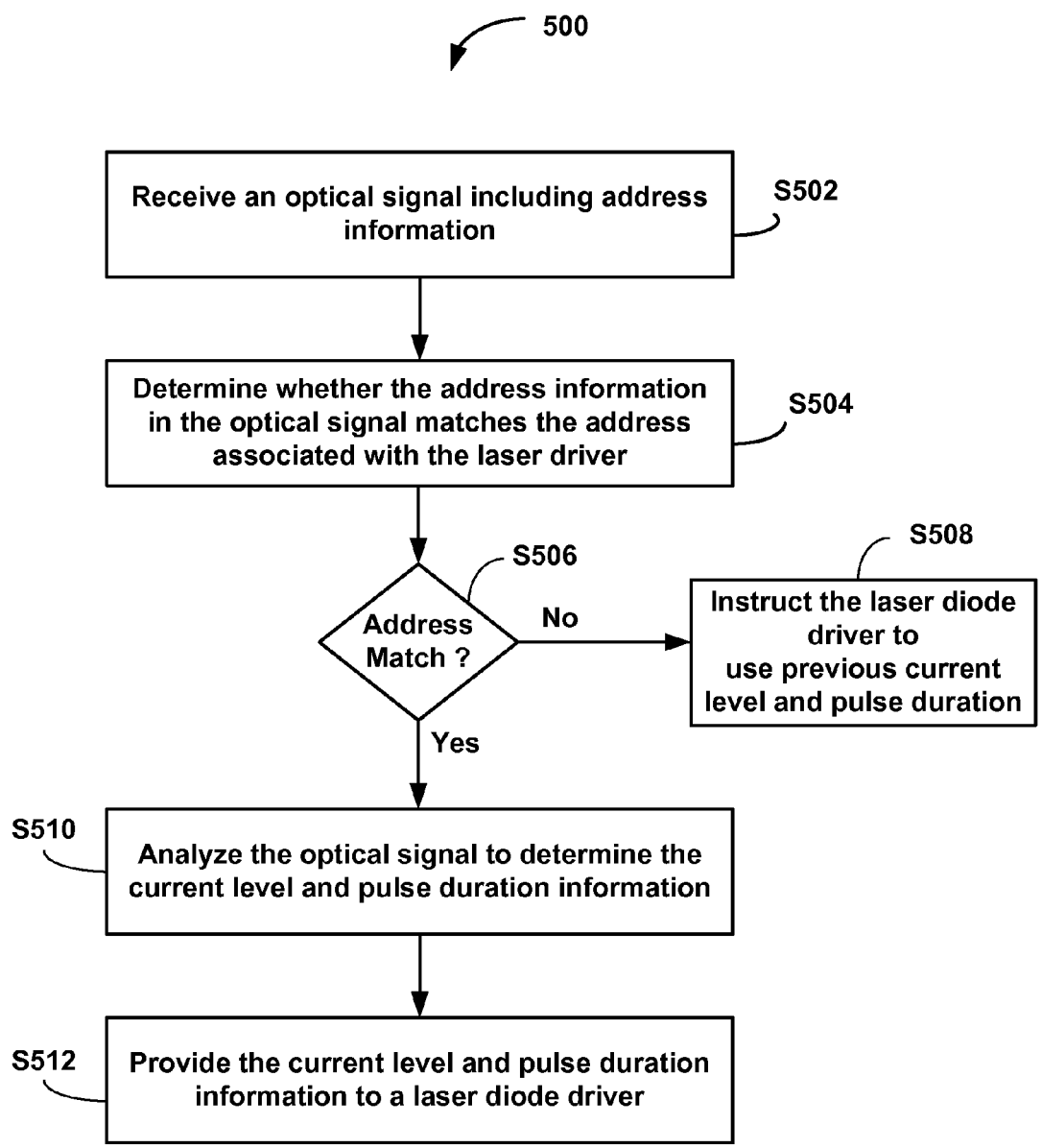
FIG. 5 is a flow diagram of a process for controlling a laser diode according to another embodiment of the present invention.

As described above, in some embodiments, the optical signal may include address information for one or more laser diodes in an array. In this instance, it is possible to send different current level and duration information to different laser diodes. FIG. 5 is a flow diagram of a process 500 for operating a laser diode according to another embodiment of the present invention. Process 500 can be performed by an optical receiver, e.g., optical receiver 108 of FIG. 1 in conjunction with a laser diode driver.

At step S502, the optical receiver coupled to a laser diode driver may receive an optical signal from an optical transmitter. The optical signal may have address information for one or more laser diode drivers. At step S504, the optical receiver can analyze the optical signal and determine whether the address information matches the address of the laser diode driver that is associated with the optical receiver. If the optical receiver determines at step S506 that the addresses do not match, it can ignore the contents of the optical signal and instruct the associated laser diode driver to operate the laser diode using previous current and duration parameters at step S508.

If the optical receiver determines at step S506 that the addresses match, the optical receiver can analyze the optical signal and extract the current value and duration information associated with the address at step S510 and provide that information to the laser diode driver at step S512. The laser diode driver can then operate the laser diode using the extracted current value and duration parameters.

It should be appreciated that the specific steps illustrated in FIG. 5 provide a particular method of operating a laser diode according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

In some embodiments, the bi-phase encoded data in the optical signal can also include a clock signal derived from a reference clock. The clock signal can be used to keep all the laser diode drivers in synchronization. In some embodiments, the clock signal may be a 155 MHz signal. Keeping the clocks for all the laser diode drivers ensures that they can all fire at the same time, which is desirable in an IFE-type power plant system.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method comprising:
providing a plurality of laser diode drivers, each coupled to a corresponding optical receiver including a photo diode; wherein each of the plurality of laser diode drivers includes a processor;
providing a laser source coupled to each of the plurality of laser diode drivers;
providing a beam control system operable to provide an optical signal associated with each of the laser sources coupled to each of the plurality of laser diode drivers, wherein the optical signal includes information about a current value for operating each of the laser sources, a duration for which each laser source is to be turned on, and a trigger signal;
receiving, by the photo diode of each of the corresponding optical receivers, the optical signal including the information about the current value for operating each of the laser sources, the duration for which each laser source is to be turned on, and the trigger signal;
analyzing, by each of the plurality of laser diode drivers, the optical signal to determine the current value and the duration for the laser source coupled to each of the plurality of laser diode drivers; and
in response to the trigger signal, synchronously, operating, by each of the plurality of laser diode drivers, the laser source coupled to each of the plurality of laser diode drivers based on the current value and the duration.

2. The method of claim 1 wherein the current value is between 0 amperes and 550 amperes.

3. The method of claim 1 wherein the duration ranges from about 1 µs to about 300 µs.

4. The method of claim 1 wherein the optical signal further includes address information associated with each of the plurality of laser diode drivers.

5. The method of claim 4 further comprising:
analyzing the optical signal to decode the address information;
determining that the address information matches an address associated with the laser diode driver; and
extracting the current value and the duration in response to the determination.

6. The method of claim 4 wherein the address information and the trigger signal are both encoded as bits in a data frame.

7. The method of claim 1 wherein the duration value is independent of the trigger signal.

8. A laser diode array comprising:
a plurality of laser diodes;
a plurality of laser diode drivers, wherein each of the plurality of laser diode drivers is coupled to at least one laser diode from the plurality of laser diodes and a corresponding optical receiver including a photo diode;
a beam control sub-system operable to provide a current value for operating each of the laser diodes in the plurality of laser diodes, a time duration for which the current value is to be applied to each of the laser diodes in the plurality of laser diodes, and a trigger signal;
a signal generator coupled to the beam control sub-system; and
an optical transmitter coupled to the signal generator and operable to transmit an optical signal including information about the current value, the time duration, and the trigger signal for each of the laser diodes in the plurality of laser diodes;
wherein each of the plurality of laser diode drivers in conjunction with the corresponding optical receiver is configured to:
receive, at the photo diode of the optical receiver, the optical signal including the current value for operating each of the laser diodes in the plurality of laser diodes, the time duration for which the current value is to be applied to each of the laser diodes in the plurality of laser diodes, and the trigger signal;

analyze the optical signal to extract the current value, the time duration, and the trigger signal for each of the plurality of laser diodes; and in response to the trigger signal, synchronously provide to the plurality of laser diodes, a current equal to the current value for each of the plurality of laser diodes for the time duration specified for each of the plurality of laser diodes in the optical signal.

9. The laser diode array of claim 8 wherein each laser diode driver has a unique address associated with it and the optical signal comprises a plurality of addresses for communicating with the plurality of laser diode drivers.

10. The laser diode array of claim 9 wherein each of the plurality of laser diode drivers in conjunction with the optical receiver is further configured to:

analyze the optical signal to determine whether the optical signal includes an address that matches its unique address;

if the optical signal includes the address that matches its unique address, extracting the current value and the time information from the optical signal; and if the optical signal does not include the address that matches its unique address, ignoring the optical signal.

11. The laser diode array of claim 9 wherein the unique address and the triggers signal are both encoded as bits in a data frame.

12. The laser diode array of claim 8 wherein the current value ranges between 0 amperes and 550 amperes.

13. The laser diode array of claim 8 wherein the time duration ranges from about 1 us to about 300 μs.

14. The laser diode array of claim 8 wherein the plurality of laser diodes comprise more than 500 laser diodes.

15. The laser diode array of claim 8 wherein each of the plurality of laser diode drivers in conjunction with the optical receiver is configured to:

analyze a subsequent optical signal only if the subsequent optical signal includes current value and time duration for each of the plurality of laser diodes that are different from previously received current value and time duration for each of the plurality of laser diodes.

16. The laser diode array of claim 8 wherein the time duration is independent of the trigger signal.

17. A system comprising:

a laser diode controller configured to provide a first current value and a first duration value for a first laser diode, a second current value and a second duration value for a second laser diode, and a trigger signal for operating the first laser diode and the second laser diode;

an optical signal generator coupled to the laser diode controller, wherein the optical signal generator is configured to:

receive the first current value, the first duration value, the second current value, the second duration value, and the trigger signal from the laser diode controller; and generate an optical signal comprising encoded data that includes the first current value, the first duration value, the second current value, the second duration value, and the trigger signal;

an optical transmitter coupled to the optical signal generator and configured to transmit the optical signal;

a first laser diode driver coupled to the optical transmitter, a first optical receiver including a first photo diode, and to the first laser diode, wherein the first laser diode driver in conjunction with the first optical receiver is configured to:

receive, at the first photo diode, the optical signal including the encoded data that includes the first current value, the first duration value, the second current value, the second duration value, and the trigger signal;

decode the encoded data to determine the first current value, the first duration value, and the trigger signal; and in response to the trigger signal, provide a current equal to the first current value to the first laser diode and for a time equal to the first duration value;

a second laser diode driver coupled to the optical transmitter, a second optical receiver including a second photo diode, and to the second laser diode, wherein the second laser diode driver in conjunction with the second optical receiver is configured to:

receive, at the second photo diode, the optical signal including the encoded data that includes the first current value, the first duration value, the second current value, the second duration value, and the trigger signal;

decode the encoded data to determine the second current value, the second duration value, and the trigger signal; and in response to the trigger signal, provide a current equal to the second current value to the second laser diode and for a time equal to the second duration value.

18. The system of claim 17 wherein the first current value and the second current value are between 1 amperes and 550 amperes.

19. The system of claim 17 wherein the first duration value and the second duration value range from about 1 us to about 300 μs.

20. The system of claim 17 wherein the first laser diode driver and the second laser diode driver are each addressable using a unique address value.

21. The system of claim 20 wherein the unique address value is represented by a 10-bit sequence.

22. The system of claim 20 wherein the unique address value is included in the optical signal.

23. The system of claim 20 wherein the unique address values and the trigger signal are both encoded as bits in a data frame.

24. The system of claim 17 wherein the first duration value and the second duration value are independent of the trigger signal.

* * * * *